(12) United States Patent
Wang et al.

(10) Patent No.: US 7,159,308 B2
(45) Date of Patent: Jan. 9, 2007

(54) METHOD OF MAKING A CIRCUIT BOARD (75) Inventors: Alan E. Wang, Gibsonia, PA (US);
Kevin C. Olson, Wexford, PA (US);
Thomas H. Di Stefano, Monte Sereno, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 11/224,197

(22) Filed: Sep. 12, 2005

(65) Prior Publication Data
US 2006/0005995 A1  Jan. 12, 2006

Related U.S. Application Data (60) Division of application No. 10/910,022, filed on Aug. 3, 2004, now Pat. No. 7,002,081, which is a division of application No. 10/227,768, filed on Aug. 26, 2002, now Pat. No. 6,844,504, which is a continuation-in-part of application No. 10/184,387, filed on Jun. 27, 2002, now Pat. No. 6,951,707.

(51) Int. Cl.
*H05K 3/36* (2006.01)
(52) U.S. Cl. .................. 29/830; 29/825; 29/846; 29/847; 438/110; 438/111
(58) Field of Classification Search ............. 29/825, 29/846, 847, 830; 438/110, 111
See application file for complete search history.

(56) References Cited

U.S. PATENT DOCUMENTS

| 3,445,806 A | 5/1969 | Band ........................ 204/181 |
| 3,451,793 A | 6/1969 | Matsushita ................... 29/194 |
| 3,469,982 A | 9/1969 | Celeste ...................... 96/35.1 |
| 3,663,389 A | 5/1972 | Koral et al. ................. 204/181 |
| 3,738,835 A | 6/1973 | Bakos ......................... 96/36 |
| 3,749,657 A | 7/1973 | LeBras et al. ............. 204/181 |
| 3,793,278 A | 2/1974 | DeBona .................... 260/29.2 |
| 3,833,436 A | 9/1974 | Hillis et al. ................. 156/13 |

(Continued)

FOREIGN PATENT DOCUMENTS

EP        573053      10/1995

(Continued)

OTHER PUBLICATIONS

"Printed wiring boards incorporating Cu-invar-Cu layers", Alfred Goberecht, Electronic Components and Applications, vol. 10, No. 1, pp. 12-16.

(Continued)

*Primary Examiner*—Carl J. Arbes
(74) *Attorney, Agent, or Firm*—Deborah M. Altman; Diane R. Meyers (57) ABSTRACT

Provided is a method of forming a circuit board including (a) providing a first conductive sheet; (b) selectively removing one or more portions of the first conductive sheet to form a first panel having a first circuit board that is coupled to a disposable part of the first panel by at least one tab that extends from an edge of the first circuit board to an edge of the disposable part of the first panel; (c) applying an insulating coating to the first circuit board so that at least each edge of the first circuit board is covered thereby; and (d) separating the first circuit board from the disposable part in a manner whereupon at least part of the tab remains attached to the first circuit board and includes an exposed edge of the conductive sheet of the first circuit board. Circuit boards formed by the method are also provided.

15 Claims, 8 Drawing Sheets

U.S. PATENT DOCUMENTS

| | | | | |
|---|---|---|---|---|
| 3,928,157 | A | 12/1975 | Suematsu et al. | 204/181 |
| 3,947,338 | A | 3/1976 | Jerabek et al. | 204/181 |
| 3,947,339 | A | 3/1976 | Jerabek et al. | 204/181 |
| 3,962,165 | A | 6/1976 | Bosso et al. | 260/29.2 EP |
| 3,975,345 | A | 8/1976 | Fessler | 260/29.2 N |
| 3,984,299 | A | 10/1976 | Jerabek | 204/181 |
| 4,001,101 | A | 1/1977 | Bosso et al. | 204/181 |
| 4,116,900 | A | 9/1978 | Belanger | 260/18 EP |
| 4,134,932 | A | 1/1979 | Kempter et al. | 260/831 |
| 4,238,385 | A | 12/1980 | Okado et al. | 260/37 EP |
| 4,238,594 | A | 12/1980 | Pampouchidis | 528/69 |
| 4,321,290 | A | 3/1982 | Thams | 427/289 |
| 4,332,711 | A | 6/1982 | Kooymans et al. | 523/402 |
| 4,343,885 | A | 8/1982 | Reardon, Jr. | 430/177 |
| 4,352,842 | A | 10/1982 | Kooymans et al. | 427/385.5 |
| 4,378,264 | A | 3/1983 | Pilette et al. | 156/238 |
| 4,397,990 | A | 8/1983 | Kooymans et al. | 525/167 |
| 4,401,774 | A | 8/1983 | Kooymans et al. | 523/402 |
| 4,405,763 | A | 9/1983 | Kooymans et al. | 525/438 |
| 4,419,467 | A | 12/1983 | Wismer et al. | 523/414 |
| 4,435,559 | A | 3/1984 | Valko | 528/73 |
| 4,436,583 | A | 3/1984 | Saili et al. | 156/659.1 |
| 4,495,229 | A | 1/1985 | Wolf et al. | 427/388.2 |
| 4,508,749 | A | 4/1985 | Brannon et al. | 427/43.1 |
| 4,592,816 | A | 6/1986 | Emmons et al. | 204/180.6 |
| 4,601,916 | A | 7/1986 | Arachtingi | 427/97 |
| 4,714,516 | A | 12/1987 | Eichelberger et al. | 427/628 |
| 4,788,246 | A | 11/1988 | Tsuchiya et al. | 524/554 |
| 5,096,556 | A | 3/1992 | Corrigan et al. | 204/181.7 |
| 5,134,056 | A | 7/1992 | Schmidt et al. | 430/313 |
| 5,153,986 | A | 10/1992 | Brauer et al. | 29/846 |
| 5,188,716 | A | 2/1993 | Schwerzel et al. | 204/181.7 |
| 5,200,461 | A | 4/1993 | Tsuchiya et al. | 524/510 |
| 5,224,265 | A | 7/1993 | Dux et al. | 29/852 |
| 5,227,008 | A | 7/1993 | Klun et al. | 156/630 |
| 5,229,550 | A | 7/1993 | Bindra et al. | 174/262 |
| 5,232,548 | A | 8/1993 | Ehrenberg et al. | 156/630 |
| 5,242,713 | A | 9/1993 | Viehbeck et al. | 427/304 |
| 5,242,780 | A | 9/1993 | Lin et al. | 430/190 |
| 5,250,164 | A | 10/1993 | Valko | 204/181.7 |
| 5,291,066 | A | 3/1994 | Neugebauer et al. | 257/750 |
| 5,298,685 | A | 3/1994 | Bindra et al. | 174/250 |
| 5,316,787 | A | 5/1994 | Frankeny et al. | 427/97 |
| 5,319,158 | A | 6/1994 | Lee et al. | 174/250 |
| 5,362,359 | A | 11/1994 | Horikoshi et al. | 156/645 |
| 5,590,460 | A | 1/1997 | DiStefano et al. | 29/830 |
| 5,600,035 | A | 2/1997 | Kahle, II et al. | 568/932 |
| 5,601,905 | A | 2/1997 | Watanabe et al. | 428/215 |
| 5,847,327 | A | 12/1998 | Fischer et al. | 174/258 |
| 5,879,808 | A | 3/1999 | Wary et al. | 428/411.1 |
| 6,066,512 | A * | 5/2000 | Hashimoto | 438/112 |
| 6,080,526 | A | 6/2000 | Yang et al. | 430/296 |
| 6,107,003 | A | 8/2000 | Kuwako | 430/314 |
| 6,130,148 | A | 10/2000 | Farnworth et al. | 438/613 |
| 6,130,149 | A | 10/2000 | Chien et al. | 438/613 |
| 6,150,284 | A | 11/2000 | Kawahara | 438/780 |
| 6,165,338 | A | 12/2000 | December et al. | 204/506 |
| 6,177,357 | B1 | 1/2001 | Lu | 438/745 |
| 6,266,874 | B1 | 7/2001 | DiStefano et al. | 29/846 |
| 6,303,230 | B1 | 10/2001 | Watanabe et al. | 428/458 |
| 6,314,639 | B1 * | 11/2001 | Corisis | 29/827 |
| 6,333,555 | B1 | 12/2001 | Farnworth et al. | 257/737 |
| 6,344,371 | B1 | 2/2002 | Fischer et al. | 438/106 |
| 6,379,865 | B1 | 4/2002 | Mao et al. | 430/271.1 |
| 6,472,726 | B1 * | 10/2002 | Hashimoto | 257/668 |
| 6,555,200 | B1 * | 4/2003 | Hashimoto | 428/136 |
| 6,559,245 | B1 | 5/2003 | Mao et al. | 525/420 |
| 2001/0029065 | A1 | 10/2001 | Fischer et al. | 438/115 |
| 2002/0004982 | A1 | 1/2002 | Haze et al. | 29/852 |
| 2002/0086236 | A1 | 7/2002 | Eitouni et al. | 430/270.1 |
| 2003/0180664 | A1 | 9/2003 | Mao et al. | 430/270.1 |
| 2003/0211425 | A1 | 11/2003 | Mao et al. | 430/311 |

FOREIGN PATENT DOCUMENTS

| | | |
|---|---|---|
| FR | 2041471 | 1/1971 |
| JP | 59133232 | 7/1984 |
| JP | 2087590 | 3/1990 |
| JP | 5320313 | 12/1993 |
| JP | 6268378 | 9/1994 |
| JP | 11021359 | 1/1999 |
| JP | 11071501 | 3/1999 |
| JP | 11145205 | 5/1999 |
| JP | 2001305750 | 11/2001 |

OTHER PUBLICATIONS

Polymers for Microelectronics, Presented at the 203$^{rd}$ National Meeting of American Chemical Society, Apr. 1992, Chapter 35, pp. 507-508, Larry F. Thompson et al.

Handbook of Flexible Circuits, p. 242, 1991, Ken Gilleo.

Handbook of Polymer Coatings for Electronics, pp. 114-118, 2$^{nd}$ Ed., James J. Licari et al.

PARYLENE: A Protective Conformal Coating for Hybrid Circuits, Speedline Technologies (2000).

SCS Parylene Specifications and Properties product literature, Speedline Technologies (2000).

Encyclopedia of Chemical Technology, Fourth Ed., Supplement Volume, pp. 863-901 (1998).

IPC-TM-650 Test Methods Manual, No. 2.3.10, Flammability of Laminates Dec. 1994, pp. 1-3.

* cited by examiner

METHOD OF MAKING A CIRCUIT BOARD

CROSS REFERENCE TO RELATED APPLICATION

This application is a divisional application of U.S. patent application Ser. No. 10/910,022, filed Aug. 3, 2004 now U.S. Pat. No. 7,002,081, which is a divisional application of U.S. patent application Ser. No. 10/227,768, filed Aug. 26, 2002 now U.S. Pat. No. 6,844,504, entitled "Single or Multi-Layer Printed Circuit Board with Recessed or Extended Breakaway Tabs and Method of Manufacture Thereof", which is incorporated herein by reference, and which is a continuation-in-part application of U.S. patent application Ser. No. 10/184,387, filed Jun. 27, 2002 now U.S. Pat. No. 6,951,707, entitled "Process for Creating Vias for Circuit Assemblies," incorporated herein by reference.

BACKGROUND OF THE INVENTION

Presently, printed circuit boards are fabricated as part of a larger panel. Each printed circuit board can be configured in any shape, although most printed circuit boards in common use are made in rectangular shapes of standard sizes. When fabrication of a printed circuit board is complete, it is cut and separated from the larger panel, mostly by way of a machine cutting or routing process in which a channel is cut around the printed circuit board. In certain designs, the channel around the printed circuit board does not completely encircle the perimeter of the printed circuit board. Rather, tabs are left at several places around the perimeter of the printed circuit board to attach it to the larger panel until the board is singulated from the larger panel by breaking the tabs. Typically, metal planes in the printed circuit board do not extend to its edge where they would be cut by the routing process. In this way, no conductive metal is left exposed on the edges of the printed circuit board.

The existing methods of cutting printed circuit boards from larger panels are unsatisfactory for high density boards because the limited dimensional stability of the printed circuit boards does not allow registration of one high density pattern to the next on the larger panel. Cut lines made around the periphery of the printed circuit board further weaken the panel material, exasperating misregistration of one pattern to the next.

Electronic systems assembled onto conventional printed circuit boards rely upon thermal conduction from integrated circuits dissipating heat to the printed circuit board to remove some of the heat from the integrated circuits. For intermediate ranges of heat, up to about 2 watts per chip, conduction to the printed circuit board is sufficient to cool the integrated circuits without the need for bulky and expensive heat sinks. In high performance systems, however, as the density of the system and the percentage of the substrate covered by the integrated circuits increases, the thermal path to the printed circuit board is less efficient. At a point when the density of the system increases sufficiently, the printed circuit board is not effective as a heat sink for the integrated circuits. However, the need for effective thermal conduction from the integrated circuits to the substrate and therefrom to the ambient becomes more important as system density increases. Because of the evolution toward higher system density and larger integrated circuit coverage, means are needed for cooling the substrate in order to maintain the integrated circuits on the substrate at a safe operating temperature.

In addition to thermal conduction, high performance systems increasingly require low impedance power and ground voltage supplies to run the integrated circuits at high clock speeds. Typically, the AC impedances of power and ground supplies are lowered by the use of low impedance bypass capacitors connected to the power and ground planes. On conventional printed circuit boards, capacitors are connected to power and ground planes through vias which extend through some thickness of the board, increasing the impedance of this contact and degrading performance of the system. As switching speeds increase, the problem of making low impedance connections between bypass capacitors and the power and ground planes becomes more important.

It is, therefore, an object of the present invention to overcome the above problems and others by providing a printed circuit board having one or more printed circuit board layers having a conductive plane which extends to the edge of the printed circuit board but which is substantially, but not completely, covered by an insulating material. The edge of the conductive layer not covered by the insulating material can be on the edge of a tab which is utilized to couple the board to a disposable part of a larger panel that the board is formed from during fabrication. The exposed edge of the conductive layer becomes exposed upon breaking the tab and singulating the printed circuit board from the disposable part of the larger panel. In one embodiment, the tab terminates in a recess in the perimeter of the printed circuit board. In another embodiment, the tab extends outward from the perimeter of the printed circuit board.

The conductive plane can be formed from metal, such as a copper foil, that can serve the dual purpose of conducting heat away from electrical components disposed on one or both surfaces of the printed circuit board or printed circuit board layer and for providing power or ground to the electrical components. The tab which extends outward from the edge of the second embodiment of the printed circuit board can be coupled to a mechanical fixture and/or an electrical fixture to provide a path for the flow of heat from the printed circuit board to externally coupled mechanical fixtures and/or to provide electrical power to the electrically conducting layer of the printed circuit board. Still other objects will become apparent to those of ordinary skill in the art upon reading and understanding the following detailed description.

SUMMARY OF THE INVENTION

The present invention is a circuit board that includes a conductive sheet sandwiched between an insulating top layer and an insulating bottom layer. The top and bottom layers and the conductive sheet define a circuit board layer having an edge that includes an edge of the conductive sheet. An insulating edge layer covers substantially all of the edges of the conductive sheet.

The conductive sheet can include at least one via therethrough. The insulating layers can be formed from a common dielectric material deposited on the conductive sheet in a manner known in the art, such as conformal coating. At least one of the top and bottom layers can have a circuit pattern formed thereon.

The insulating edge layer can include at least one opening where a part of the edge of the conductive sheet is exposed in response to separating the circuit board layer from a panel. In one embodiment, the exposed part of the edge can be within a perimeter of the circuit board layer. Moreover, the exposed part of the edge can be on a tab attached to the circuit board layer where the tab extends into a recess in the circuit board layer.

The top and bottom insulating layers and the conductive sheet define a panel that includes the circuit board layer coupled to a disposable part of the panel by the tab. The insulating edge layer covers the edges of the tab and the circuit board layer prior to singulation of the circuit board layer from the disposable part of the panel. The tab is responsive to a breaking force applied thereto for breaking whereupon the circuit board layer separates from the disposable part of the panel with at least part of the tab remaining attached to the circuit board layer.

In another embodiment, the conductive sheet includes a tab that extends outward from between the top layer and the bottom layer. At least part of the edge of the tab is exposed when the circuit board layer is separated from the disposable part of the panel. The at least part of the edge is outside a perimeter of the circuit board layer. The tab in this embodiment has a top surface and a bottom surface. At least part of one of the top surface and the bottom surface of the tab can be exposed, i.e., not covered by insulating material.

A plurality of circuit board layers can be laminated together to form a multi-layer circuit board. The tab of one circuit board layer of the multi-layer circuit board can be offset from the tab of another circuit board layer of the multi-layer circuit board. An electronic component can be connected between the tab of one circuit board layer and the tab of the other circuit board layer. The conductive sheet of one circuit board layer can define the ground plane of the multi-layer circuit board and the conductive sheet of another circuit board layer can define a power plane of the multi-layer circuit board.

The invention is also a method of forming a circuit board that includes providing a first conductive sheet and selectively removing one or more portions of the first conductive sheet to form a first panel having a first circuit board that is coupled to a disposable part of the first panel by at least one tab that extends from an edge of the first circuit board to an edge of the disposable part of the first panel. An insulating coating is applied to the first circuit board so at least each edge of the first circuit board is covered thereby. The first circuit board is separated from the disposable part in a manner whereupon at least part of the tab remains attached to the first circuit board and this part of the tab includes an exposed edge of the conductive sheet of the first circuit board.

The insulating coating can be applied to the first circuit board in a manner whereupon at least each edge of the at least one tab is covered thereby. The at least part of the tab can terminate one of inside and outside a perimeter of the first circuit board.

The method can also include providing a second conductive sheet and selectively removing one or more portions of the second conductive sheet to form a second panel having a second circuit board that is coupled to a disposable part of the second panel by at least one tab that extends from an edge of the second circuit board to an edge of the disposable part of the second panel. An insulating coating is applied to the second circuit board so that at least each edge of the second circuit board is covered thereby. The first and second circuit boards are then laminated together and the second circuit board is separated from the disposable part of the second panel in a manner whereupon at least part of the tab remains attached to the second circuit board and the at least part of the tab includes an exposed edge of the conductive sheet of the second circuit board.

The at least part of each tab can terminate inside or outside a perimeter of the corresponding circuit board. When the first and second circuit boards are laminated together, the at least one tab of the first circuit board is offset from the at least one tab of the second circuit board. An electrical component can be electrically connected between the at least one tab of the first circuit board and the at least one tab of the second circuit board.

DETAILED DESCRIPTION OF THE INVENTION

Figure 1:
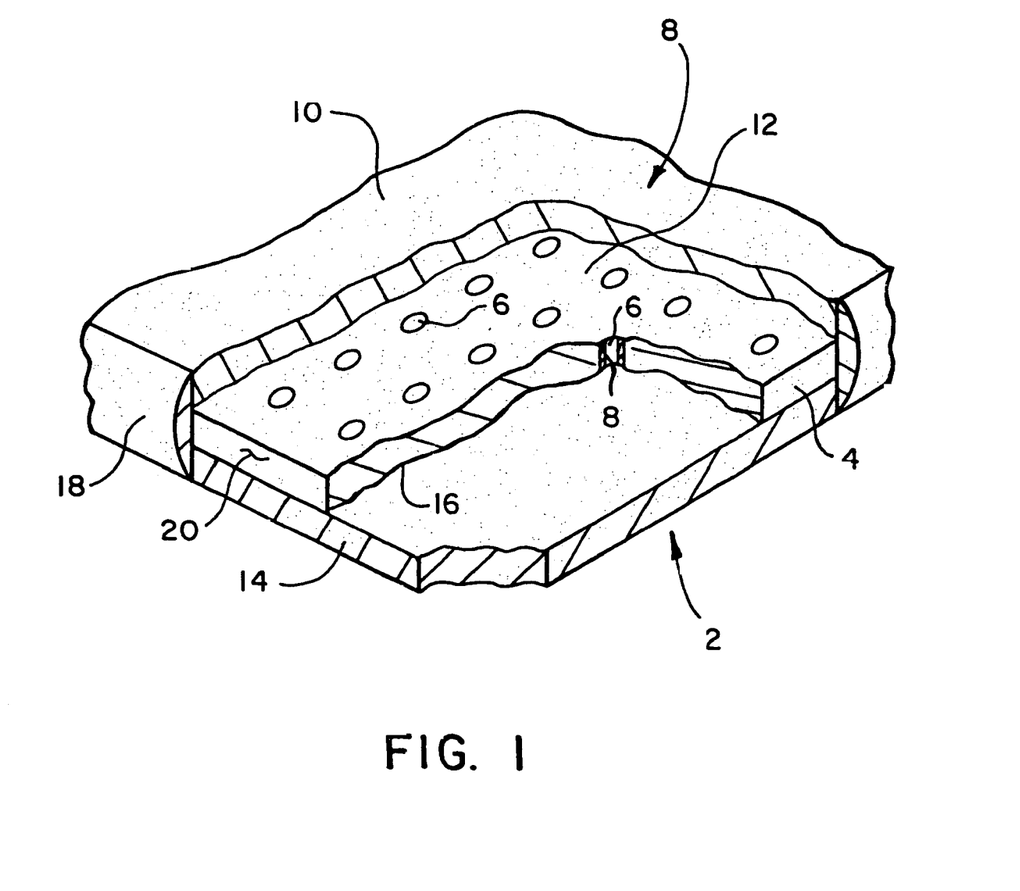
FIG. 1 is a cutaway perspective view of a printed circuit board layer having a perforate conductive plane surrounded by an insulating material in accordance with the present invention.

With reference to FIG. 1, a printed circuit board layer 2 includes an electrically conductive sheet or foil 4. Sheet 4 can be formed from a copper foil, an iron-nickel alloy, or combinations thereof. Sheet 4 can be a perforate sheet as shown in FIG. 1 or can be a solid sheet. It is desirable for sheet 4 to have a coefficient of thermal expansion comparable to that of silicon materials from which integrated circuits are typically prepared in order to prevent failure of adhesion joints utilized to adhere the integrated circuit or a packaged integrated circuit (not shown) to printed circuit board layer 2. Describing sheet 4 as perforate means that sheet 4 is a mesh sheet having a plurality of through-holes or vias 6 spaced at regular intervals.

An electrically insulative coating 8 is formed around sheet 4. This coating 8 can be formed around sheet 4 in any manner known in the art, such as conformal coating. More specifically, coating 8 forms an insulating top layer 10 which covers a top surface 12 of sheet 4, an insulating bottom layer 14 which covers a bottom surface 16 of sheet 4 and an insulating edge layer 18 which covers an edge 20 of sheet 4. When sheet 4 is coated with coating 8, an interior surface of each through-hole or via 6 is also coated with coating 8. Thus, no portion of sheet 4 is left uncovered by coating 8.

Figure 2:
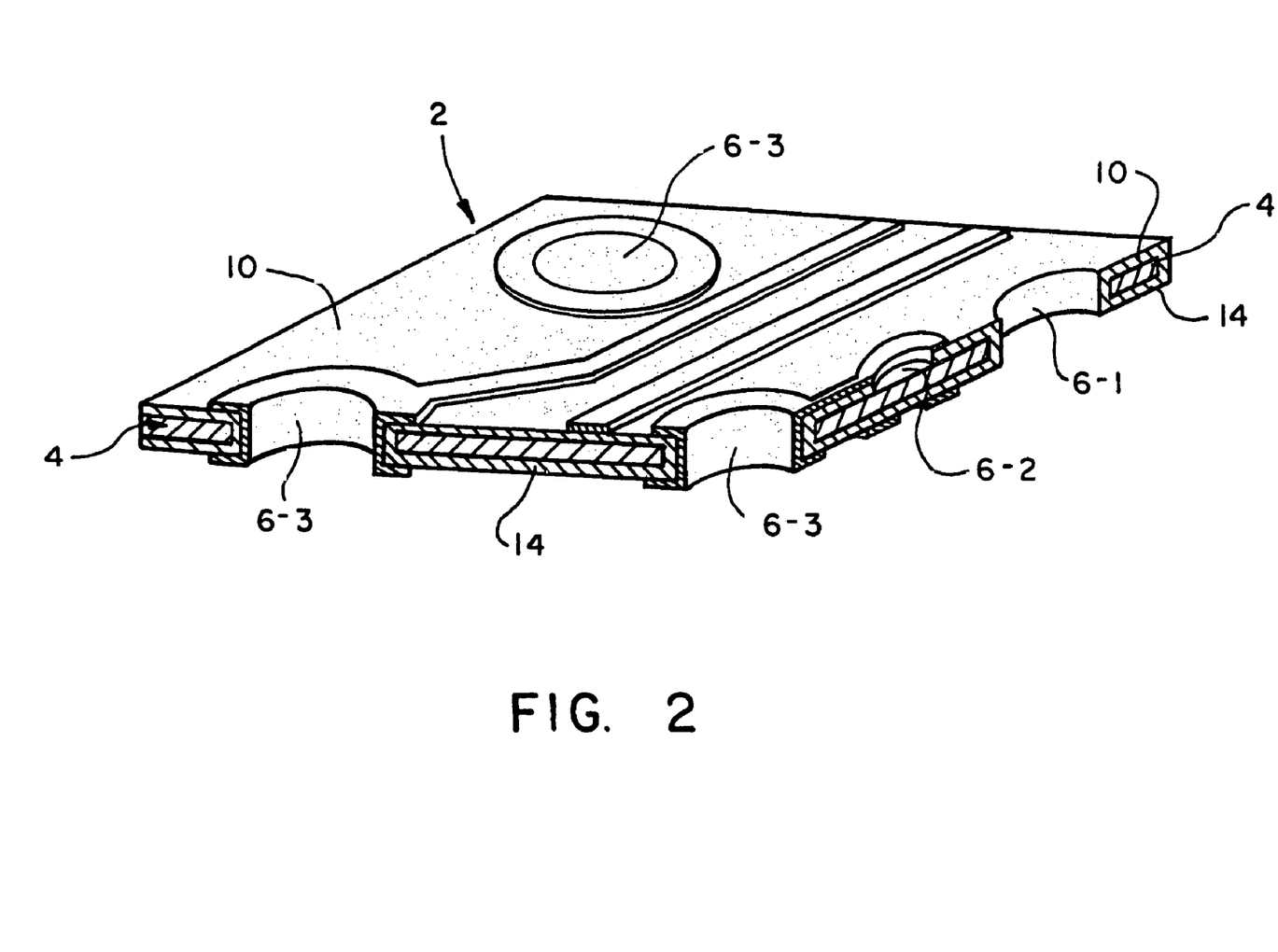
FIG. 2 is a cutaway perspective view of a portion of a printed circuit board layer of the type shown in FIG. 1 including a circuit pattern formed on the outward facing surfaces thereof.

With reference to FIG. 2, and with continuing reference to FIG. 1, printed circuit board layer 2 formed in the above-described manner can have a conductive pattern formed on the outward facing surface of top layer 10 and/or the outward facing surface of bottom layer 14 by conventional processes. Specifically, utilizing one or more photolithographic techniques and one or more metallization techniques, the conductive pattern can be formed on the outward facing surface of top layer 10 and/or the outward facing surface of bottom layer 14. This conductive pattern can include un-plated through-holes or vias 6-1, plated, blind through-holes or vias 6-2, and/or plated through-holes or vias 6-3. Additional details regarding formation of printed circuit board layer 2 and for forming a conductive pattern, including one or more of the various types of through-holes or vias 6, on top layer 10 and/or bottom layer 14 can be found in U.S. patent application Ser. No. 10/184,387, filed Jun. 27, 2002, entitled "Process For Creating Vias For Circuit Assemblies" which is assigned to the same Assignee as the present application and which is incorporated herein by reference.

The preparation of one or more printed circuit board layers 2 in a panel form and the assembly of plural printed circuit board layers to form a multi-layer printed circuit board assembly will now be described.

Figure 3:
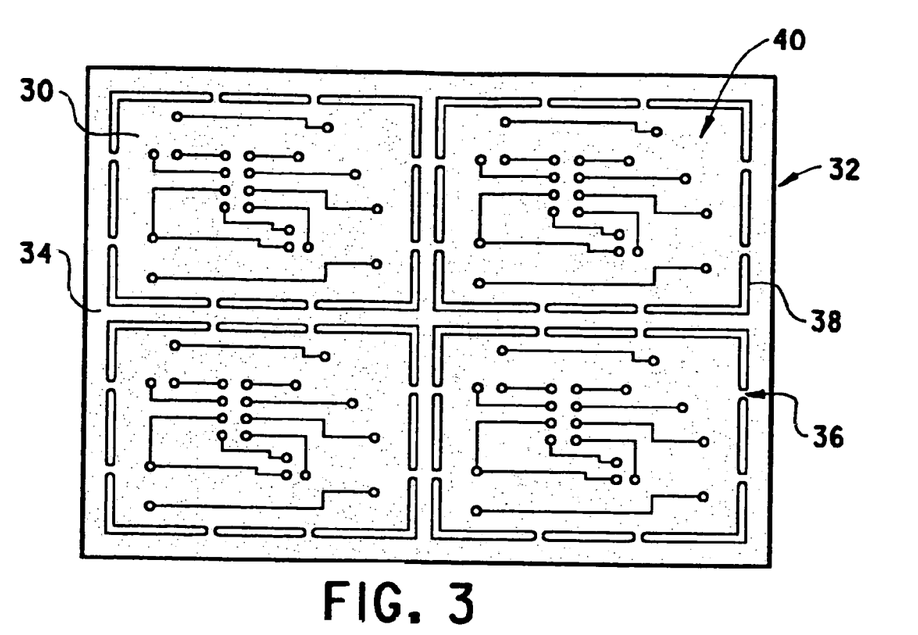
FIGS. 3 and 4 are plan views of panels having different circuit board layers formed therefrom in accordance with one embodiment of the present invention.

With reference to FIG. 3, in accordance with a first embodiment of the invention, one or more first printed circuit board (PCB) layers 30 are fabricated as part of a panel 32. Each first PCB layer 30 is surrounded by a disposable part 34 of panel 32. In accordance with the present invention, each first PCB layer 30 is coupled to disposable part 34 of panel 32 by one or more tabs 36.

The general steps to prepare panel 32 to the form shown in FIG. 3 will now be described. Initially, a first conductive sheet like conductive sheet 4, of the size of panel 32 is provided. This sheet can either be a solid sheet or a perforate sheet depending on the application. Next, cut lines or slots 38 are formed in the conductive sheet by pattern etching or a machine cutting or routing process to define the perimeter of each first PCB layer 30 of panel 32. These slots 38 are interrupted by tabs 36 which hold each first PCB layer 30 to disposable part 34 during processing.

Next, an electrically insulative coating, like coating 8, is deposited on the conductive sheet forming panel 32 in a manner whereupon the top surface, the bottom surface, and the edges of the electrically conductive sheet associated with each first PCB layer 30 that were exposed during the formation of slots 38 are covered thereby. If the conductive sheet is perforate, the electrically insulative coating also covers the interior surface of each through-hole or via. In addition, the top and bottom surfaces and the edges of each tab 36 defined during the formation of slots 38 can also be covered by the electrically insulative coating. The top and bottom surfaces and the edges of disposable part 34 defined during formation of slots 38 can also be covered with the electrically insulative coating. However, this is not required. Typically, however, all of the edges, surfaces and, if vias are provided, the interior surface of each via of the conductive sheet of panel 32 are covered by the electrically insulative coating.

Next, photolithographic processing techniques and metallization techniques known in the art and described in the above-identified United States patent application incorporated herein by reference are utilized to define a circuit pattern 40 on one or both of the exposed surfaces of the electrically insulative coating deposited on the portion of the electrically conductive sheet associated with each first PCB layer 30.

If each first PCB layer 30 is ready for use after circuit pattern 40 is formed thereon, each first PCB layer 30 can be singulated from panel 32 by applying a breaking force to the tabs connecting each first PCB layer 30 to disposable part 34. However, if desired, one or more additional layers of electrically insulative coating (not shown) and circuit patterns (not shown) can be formed over circuit pattern 40, with the various layers of circuit patterns interconnected in a desired manner utilizing conventional processes. Thereafter, each first PCB layer 30 can be singulated from panel 32 by applying a breaking force to each tab connecting each first PCB layer 30 to disposable part 34.

Figure 4:
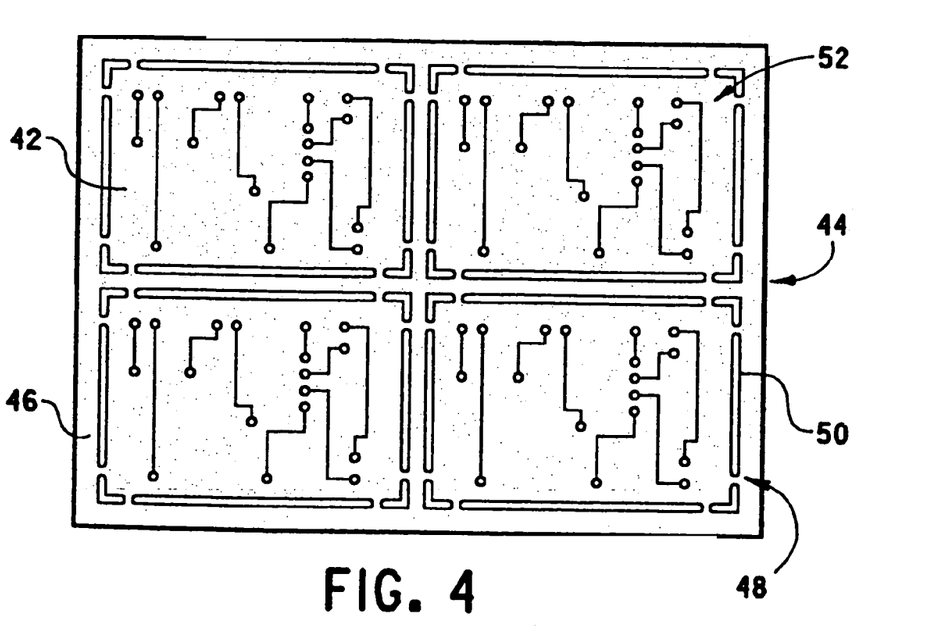

Alternatively, each first PCB layer 30 of panel 32 can be laminated to a second PCB layer 42 of a panel 44 shown in FIG. 4. Panel 44 includes one or more second PCB layers 42 connected to a disposable part 46 of panel 44 by tabs 48 defined during formation of slots 50 in the electrically conductive sheet of panel 44 in the same manner described above in connection with the formation of slots 38 in panel 32.

An electrically insulative coating is deposited on the conductive sheet forming panel 44 in a manner whereupon the top surface, the bottom surface and the edges of electrically conductive sheet associated with each second PCB layer 42 that were exposed during the formation of slots 50 are covered thereby. If the conductive sheet is perforate, the electrically insulative coating also covers the interior surface of each through-hole or via. In addition, the top and bottom surfaces and the edges of each tab 48 defined during the formation of slots 50 can also be covered by the electrically insulative coating. The top and bottom surfaces and the edges of disposable part 46 defined during formation of slots 50 can also be covered with the electrically insulative coating. However, this is not required. Typically, however, all of the edges, surfaces and, if vias are provided, the interior surface of each via of the conductive sheet of panel 44 are covered by the electrically insulative coating.

Each second PCB layer 42 has a circuit pattern 52 formed on one or both of the exposed surfaces of the electrically insulative coating deposited on the portion of the electrically conductive sheet associated with each second PCB layer 42. If desired, each second PCB layer 42 can include one or more additional layers of electrically insulative coating and circuit patterns formed over circuit pattern 52, with the various layers of circuit patterns interconnected in the desired manner utilizing conventional processes.

Figure 5:
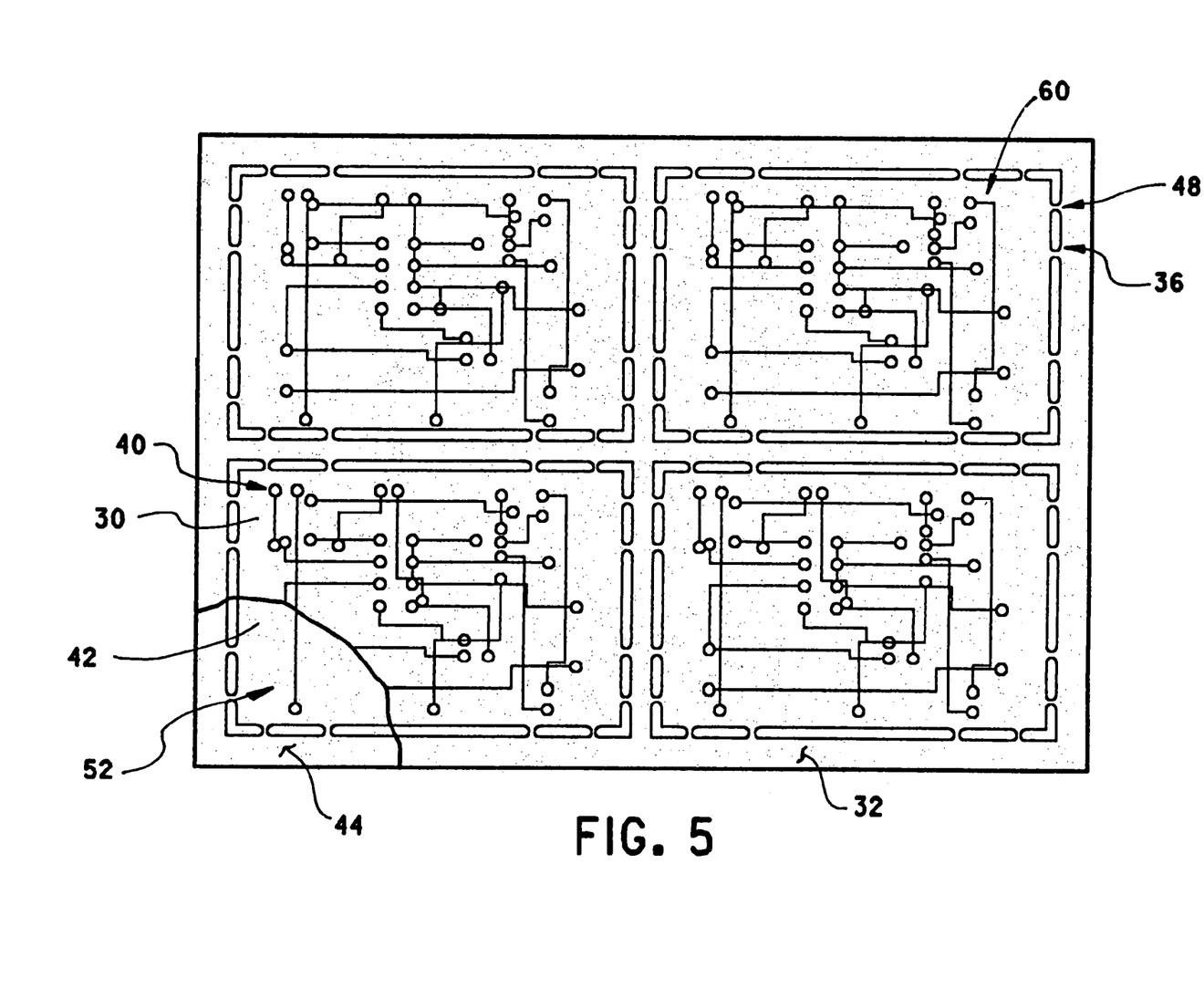
FIG. 5 is a plan view of the panels shown in FIGS. 3 and 4 laminated together with the circuit board layers thereof in registry.

With reference to FIG. 5, and with ongoing reference to FIGS. 3 and 4, panels 32 and 44 can be laminated together in a manner known in the art, with each first PCB layer 30 positioned in registry with a corresponding second PCB layer 42 to form a multi-layer PCB assembly 60. Appropriate techniques known in the art can be utilized to form one or more electrical connections between each circuit pattern 40 and the corresponding circuit pattern 52. For simplicity of description, the formation of these one or more electrical connections between circuit pattern 40 and corresponding circuit pattern 52 will not be described herein.

As shown best in FIG. 5, tabs 36 of panel 32 do not overlay tabs 48 of panel 44 when panels 32 and 44 are laminated together. In this manner, the PCB layers 30 and 42 forming each multi-layer PCB assembly 60 can be singulated from their disposable parts 34 and 46, respectively, independent of each other. If desired, however, one or more tabs 36 and 48 can be in alignment with each other when panels 32 and 44 are laminated.

Figure 6:
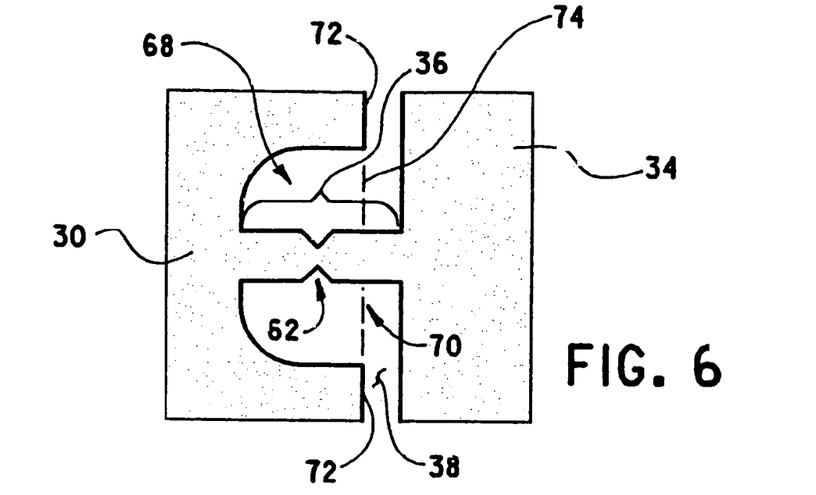
FIG. 6 is an isolated plan view of a tab which the panels in FIGS. 3 and 4 utilize to connect their circuit board layers to disposable parts of the panels.
Figure 7:
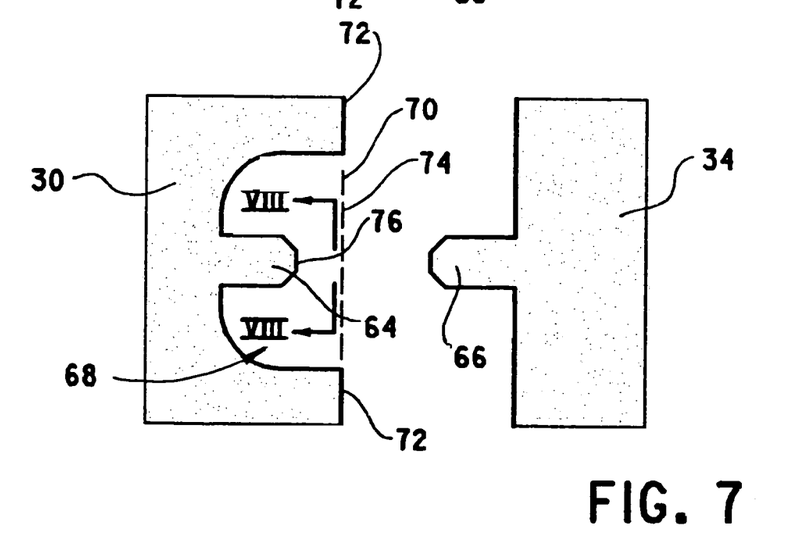
FIG. 7 is an isolated plan view of the tab shown in FIG. 6 after breaking in response to the application of a breaking force applied thereto.

With reference to FIGS. 6 and 7, and with continuing reference to FIGS. 3–5, each tab 36 and 48 will now be described with respect to an exemplary tab 36 of panel 32. However, it is to be appreciated that each tab 48 of panel 44 is similar to each tab 36 of panel 32 and, therefore, the following description of exemplary tab 36 is applicable to each tab 48.

As shown in FIG. 6, exemplary tab 36 extends between first PCB layer 30 and disposable part 34. To facilitate breaking, exemplary tab 36 includes a narrowing 62, also known as a Charpy notch, along its length. This narrowing 62 enables exemplary tab 36 to break at a well-defined position whereupon exemplary tab 36 separates into a first part 64 that remains attached to first PCB layer 30 and a second part 66 that remains attached to disposable part 34.

The ends of slots 38 on opposite sides of exemplary tab 36 define a recess 68 within a perimeter 70 of first PCB layer 30. For purpose of the present description, perimeter 70 of first PCB layer 30 includes the outer edge 72 of first PCB layer 30 and the imaginary extension 74 of outer edges 72 across each recess 68. As shown, the narrowing 62 of each tab 36 is within perimeter 70 of first PCB layer 30. Hence, when exemplary tab 36 separates into first part 64 and second part 66, a distal end 76 of each first part 64 terminates within recess 68.

Figure 8:
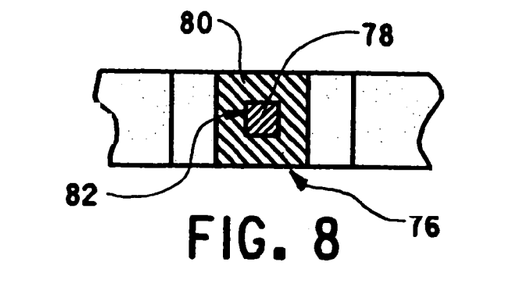
FIG. 8 is a view taken along lines VIII—VIII in FIG. 7.

With reference to FIG. 8, and with continuing reference to all previous Figs., since first PCB layer 30 and exemplary tab 36 include an electrically conductive sheet 78, like sheet 4 in FIG. 1, coated with an electrically insulative coating 80, like coating 8 in FIG. 1, breaking exemplary tab 36 exposes a small portion 82 of the edge of electrically conductive sheet 78 and the surrounding electrically insulative coating 80. Since only the distal end 76 of first part 64 of exemplary tab 36 includes small portion 82 of electrically conductive sheet 78 exposed, substantially all of the edge of electrically conductive sheet 78 is covered by electrically insulative coating 80 and, more particularly, the insulating edge layer of electrically insulative coating 80. Accordingly, inadvertent electrical contact with the edge of electrically conductive sheet 78 covered with the insulating edge layer of electrically insulative coating 80 is avoided.

The electrically conductive sheet of first PCB layer 30 and second PCB layer 42 can be utilized to conduct heat away from electrical components disposed on one or both surfaces thereof. In addition, the electrically conductive sheets of PCB layers 30 and 42 of each multi-layer PCB assembly 60 can be utilized to provide power and ground to electrical components disposed on the outward facing surfaces of multi-layer PCB assembly 60. This is accomplished by connecting the power lead of each integrated circuit disposed on multi-layer PCB assembly 60 to the conductive sheet of one PCB layer 30 and 42 and connecting the ground lead of each integrated circuit to the conductive sheet of the other PCB layer 30 and 42. The conductive sheet of each PCB layer 30 and 42 can then be connected to an appropriate one of a power terminal and a ground terminal of an external power supply via the small portion 82 of the edge of the electrically conductive sheet exposed on the first part 64 of one or more tabs 36 by suitable fixture means.

Figure 9:
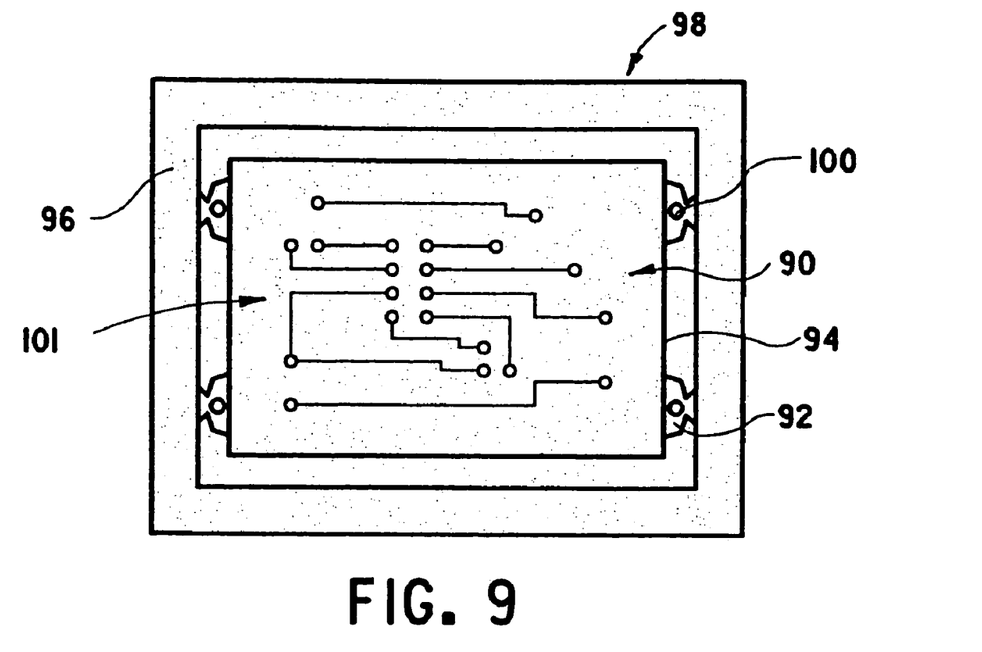
FIGS. 9 and 10 are plan views of panels including printed circuit board layers in accordance with another embodiment of the present invention.

With reference to FIG. 9, in accordance with a second embodiment of the invention, a first PCB layer 90 is fabricated in the same manner as first PCB layer 30 discussed above in connection with FIG. 3. In this second embodiment, however, one or more tabs 92 extend outward from a perimeter 94 of first PCB layer 90 and connect it to a disposable part 96 of a panel 98 that also includes first PCB layer 90 and tab 92. In a manner similar to PCB layers 30 and 42 and tabs 36 and 48, respectively, first PCB layer 90 and tabs 92 can be formed from an electrically conductive sheet having its top and bottom surfaces and edges coated with an electrically insulative coating. However, in this second embodiment, the electrically insulative coating can be omitted from one or more tabs 92 or can be removed from one or more tabs 92 after deposit. One or more of tabs 92 can each include a mounting hole 100 that can be utilized to couple tab 92 to mounting hardware or external electrical circuitry, such as a power supply.

A circuit pattern 101 can be formed on one or both exposed surfaces of first PCB layer 90 utilizing photolithographic processing techniques and metallization techniques known in the art. Once first PCB layer 90 has circuit pattern 101 formed on one or both exposed surfaces thereof, first PCB layer 90 and each tab 92 can be singulated from panel 98, especially disposable part 96, and utilized as is. If desired, however, one or more additional layers of electrically insulative coating and circuit patterns can be formed over circuit pattern 101, with the various layers of circuit patterns interconnected in a desired manner utilizing conventional processes. Thereafter, first PCB layer 90 and each tab 92 can be singulated from panel 98.

Figure 10:
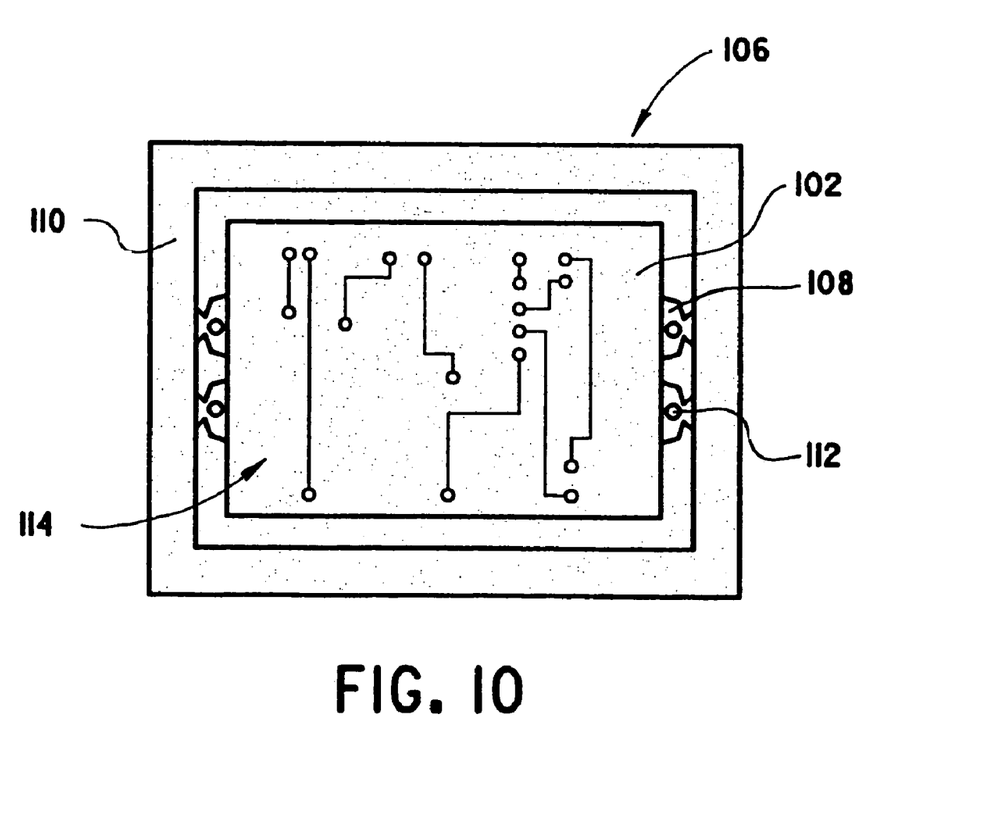
Figure 11:
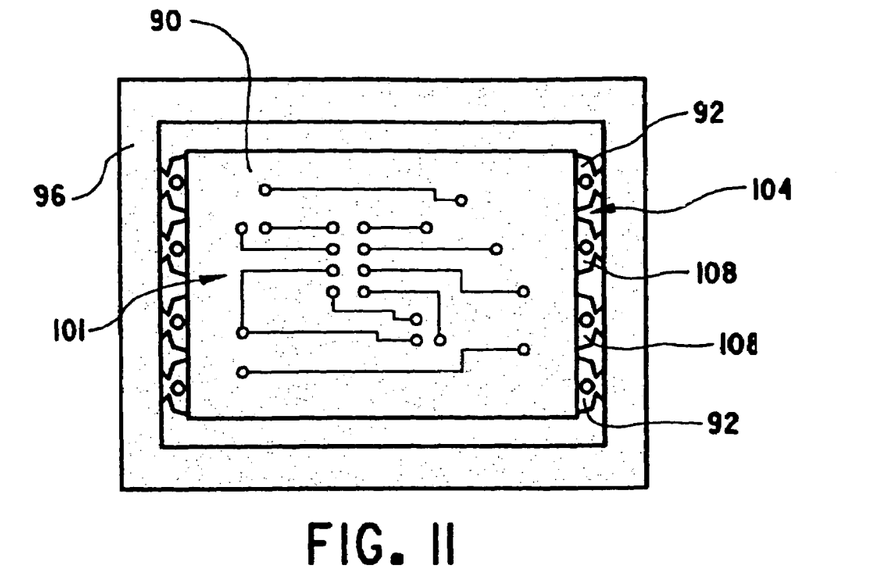
FIG. 11 is a plan view of the panels shown in FIGS. 9 and 10 laminated together with the circuit board layers thereof in registry.
Figure 12:
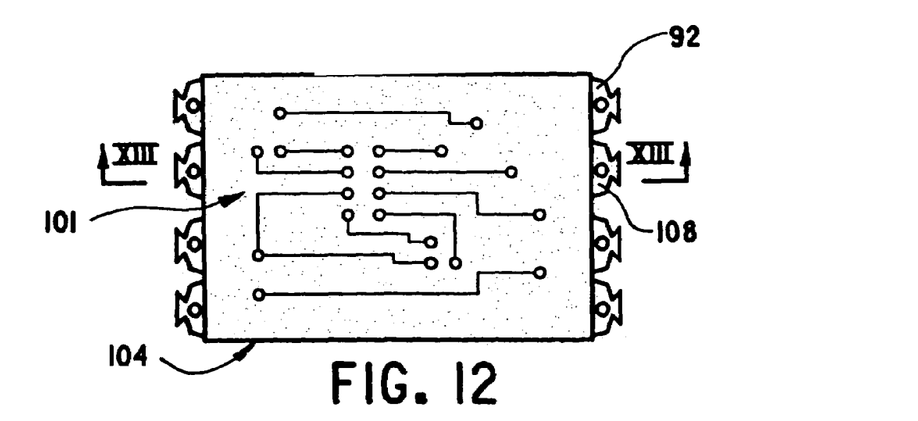
FIG. 12 is a plan view of the laminated printed circuit board layers shown in FIG. 11 singulated from the disposable parts of their respective panels.
Figure 13:
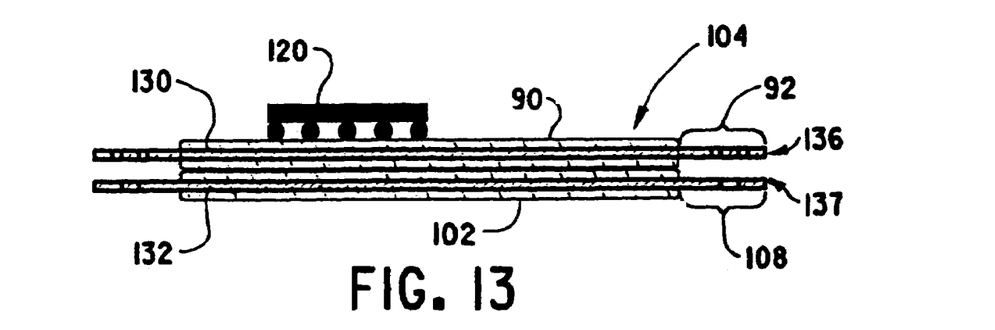
FIG. 13 is a section taken along XIII—XIII in FIG. 12.

With reference to FIGS. 10 and 11, if desired, panel 98 can be laminated to a panel 106 in a manner known in the art with first PCB layer 90 in registry with a second PCB layer 102 of panel 106 to form a multi-layer PCB assembly 104, shown best in FIGS. 11–13. Second PCB layer 102 is part of panel 106 that includes tabs 108 and disposable part 110. One or more tabs 108 can each include a mounting hole 112 that can be utilized to couple tab 108 to appropriate mechanical hardware or electrical circuitry. In a manner similar to PCB layers 30 and 42 and tabs 36 and 48, respectively, second PCB layer 102 and tabs 108 can be formed from an electrically conductive sheet coated with an electrically insulative coating. However, in this second embodiment, the electrically insulative coating can be omitted from each tab 108 or can be removed from each tab 108 after deposit.

A circuit pattern 114 can be formed on one or both surfaces of second PCB layer 102 utilizing photolithographic processing techniques and metalization techniques known in the art. Once first PCB layer 90 and second PCB layer 102 are laminated in registry, appropriate techniques known in the art can be utilized to form one or more electrical connections between circuit pattern 101 and the circuit pattern 114.

With reference to FIG. 12, and with continuing reference to FIG. 11, next, a breaking force can be applied to each tab 92 and 108 to singulate first and second PCB layers 90 and 102 and, hence, multi-layer PCB assembly 104, from disposable parts 96 and 110. To facilitate the application of a breaking force to each tab 92 and 108, tabs 92 and 108 can be positioned on first and second PCB layers 90 and 102 so that they do not overlay each other. As shown, all of each tab 92 and all of each tab 108 remains with first and second PCB layers 90 and 102, respectively. To this end, a breaking force applied to each tab 92 and each tab 108 causes it to break from disposable part 96 and 110, respectively. To enable each tab 92 and 108 to break cleanly from disposable parts 96 and 110, a break or score line can be formed at the boundary of each tab 92 and 108 and each disposable part 96 and 110 to weaken the mechanical connection therebetween. A suitable breaking force can be applied to each tab 92 and 108 by a mechanical press having a ram with a suitably shaped tip for causing the breaking force to be applied to the tab, especially the score line.

Figure 14:
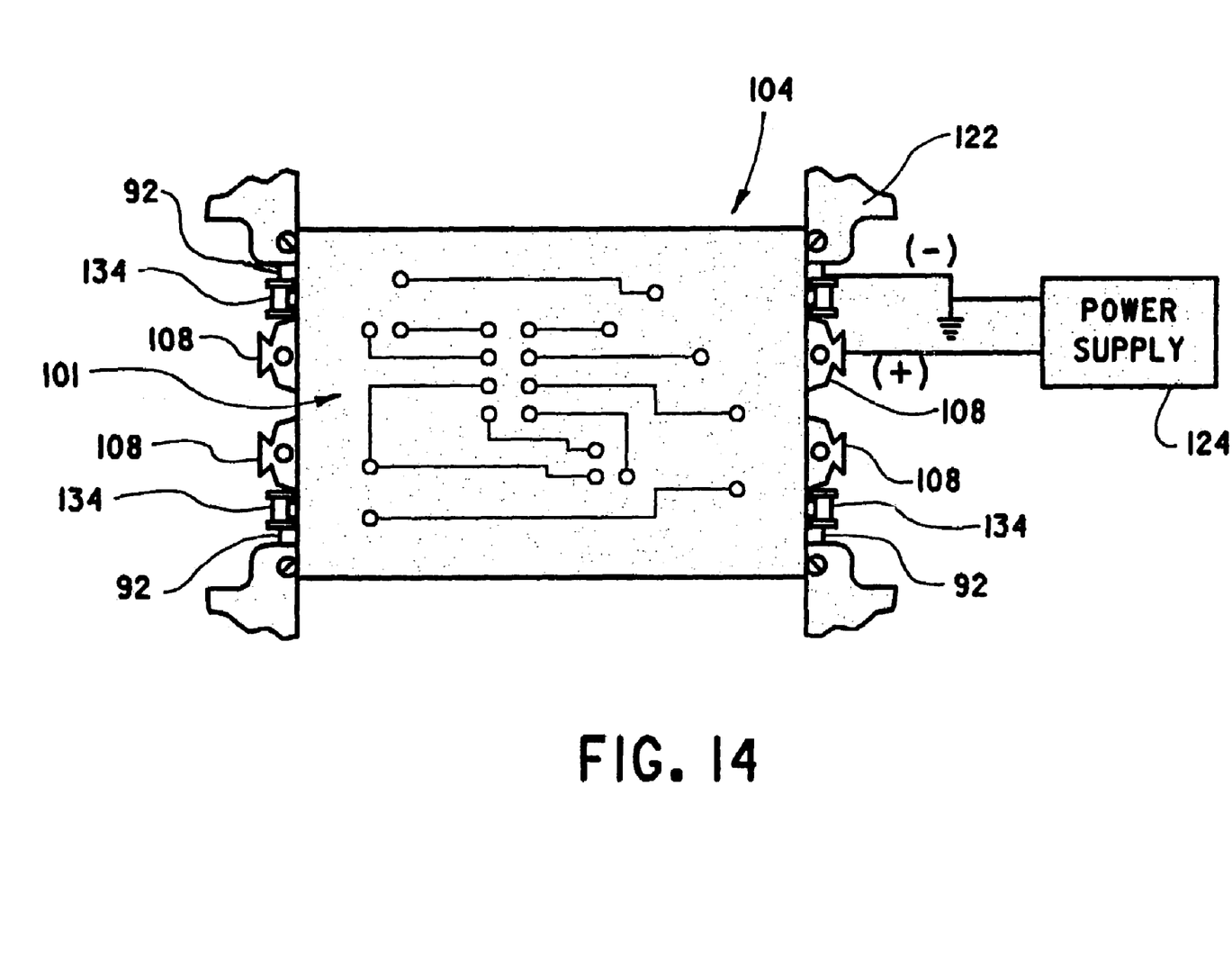
FIG. 14 is a plan view of the singulated laminated circuit board layers shown in FIG. 12 with certain tabs thereof coupled to a mounting fixture and with certain tabs thereof coupled to an electrical fixture.

With reference to FIG. 13, and with continuing reference to FIGS. 11 and 12, at a suitable time one or more electrical components 120, such as a packaged integrated circuit, an unpackaged flip-chip integrated circuit, a resistor, a capacitor and/or an inductor can be coupled to appropriate points of circuit pattern 101 and/or circuit pattern 114 of multi-layer PCB assembly 104 in a manner known in the art. Moreover, as shown in FIG. 14, one or more tabs 92 and/or 108 can be coupled to a mounting fixture 122 or an electrical fixture, such as a power supply 124. Since each tab 92 is part of an electrically conductive sheet 130 associated with first PCB layer 90, and since each tab 108 is part of an electrically conductive sheet 132 associated with second PCB layer 102, connecting one or more tabs 92 to one terminal of power supply 124 and connecting one or more tabs 108 to the other terminal of power supply 124 biases electrically conductive sheets 130 and 132 accordingly. The provisioning of electrical power to electrically conductive sheets 130 and 132 in this manner simplifies the provisioning of electrical power to each electrical component, e.g., electrical component 120, coupled to one or both outward facing surfaces of multi-layer PCB assembly 104.

In addition, other electrical components, such as one or more capacitors 134, can be connected between adjacent pairs of tabs 92 and 108. The inclusion of one or more capacitors 134 between adjacent pairs of tabs 92 and 108 reduces the need to install filter capacitors on one or both of the outward facing surfaces of multi-layer PCB assembly 104 to provide electrical filtering for electrical components disposed thereon.

Like the distal end of exemplary tab 36, the distal end 136 of each tab 92 and the distal end 137 of each tab 108 includes an exposed edge of electrically conductive sheet 130 and 132, respectively. In addition, all or part of the top surface and/or bottom surface of the electrically conductive sheets 130 and 132 associated with adjacent pairs of tabs 92 and 108, respectively, can be exposed in order to facilitate the connection of electronic components, such as capacitors 134, therebetween.

As can be seen, the present invention provides a printed circuit board having one or more printed circuit board layers each of which has a conductive plane that extends to the edge of the printed circuit board but which is substantially, but not completely, covered by an insulating material. The edge of the conductive layer not covered by the insulating material is positioned on the edge of a tab which is utilized to couple the board to a disposable part of a larger panel that the printed circuit board is formed from during fabrication. The exposed edge of the conductive layer becomes exposed upon breaking the tab and singulating the printed circuit board from the disposable part of the panel.

The conductive layer of each circuit board layer can serve the dual purpose of conducting heat away from electrical components disposed on one or both surfaces of the printed circuit board or printed circuit board layer and providing power or ground to the electrical components.

The present invention has been described with reference to the preferred embodiments. Obvious modifications and alterations will occur to others upon reading and understanding the preceding detailed description. For example, multi-layer PCB assembly 60 was described as being formed by laminating together PCB layers 30 and 42. However, a multi-layer PCB assembly can be formed from three or more PCB layers laminated together and electrically connected in a desired manner. Moreover, an electrical component, e.g., capacitor 134, was described as being connected to tabs 92 and 108 of adjacent PCB layers 90 and 102 of multi-layer PCB assembly 104. However, an electrical component can be connected between tabs of adjacent or non-adjacent PCB layers of a multi-layer PCB assembly having three or more PCB layers. It is intended that the invention be construed as including all such modifications and alterations insofar as they come within the scope of the appended claims or the equivalents thereof.

We claim:

1. A method of forming a circuit board comprising:
(a) providing a first conductive sheet;
(b) selectively removing one or more portions of the first conductive sheet to form a first panel having a first circuit board that is coupled to a disposable part of the first panel by at least one tab that extends from an edge of the first circuit board to an edge of the disposable part of the first panel;
(c) applying an insulating coating to the first circuit board so that at least each edge of the first circuit board is covered thereby; and
(d) separating the first circuit board from the disposable part in a manner whereupon at least part of the tab remains attached to the first circuit board and includes an exposed edge of the conductive sheet of the first circuit board.

2. method as set forth in claim 1, wherein step (c) further includes applying the insulating coating to the first circuit board so that at least each edge of the at least one tab is covered thereby.

3. The method as set forth in claim 1, wherein the at least part of the tab terminates inside a perimeter of the first circuit board.

4. The method as set forth in claim 1, further including:
(e) providing a second conductive sheet;
(f) selectively removing one or more portions of the second conductive sheet to form a second panel having a second circuit board that is coupled to a disposable part of the second panel by at least one tab that extends from an edge of the second circuit board to an edge of the disposable part of the second panel;
(g) applying an insulating coating to the second circuit board so that at least each edge of the second circuit board is covered thereby;
(h) laminating the first and second circuit boards together; and
(i) separating the second circuit board from the disposable part of the second panel in a manner whereupon at least part of the tab remains attached to the second circuit board and includes an exposed edge of the conductive sheet of the second circuit board.

5. The method as set forth in claim 4 wherein the at least part of each tab terminates inside a perimeter of the corresponding circuit board.

6. The method as set forth in claim 4, wherein the at least part of each tab terminates outside a perimeter of the corresponding circuit board.

7. The method as set forth in claim 6, wherein the at least one tab of the first circuit board is offset from the at least one tab of the second circuit board.

8. The method as set forth in claim 6, further including the step of electrically connecting an electrical component between the at least one tab of the first circuit board and the at least one tab of the second circuit board.

9. A method of forming a circuit board comprising:
(a) providing a first conductive sheet;
(b) selectively removing one or more portions of the first conductive sheet thereby defining a first circuit board, a first disposable part and at least one tab that extends between an edge of the first circuit board and an edge of the first disposable part;
(c) coating each edge of the first circuit board where one of the tabs does not extend therefrom with an insulating material; and
(d) separating the first circuit board from the first disposable part via each tab that extends therebetween such that said separation exposes one of (1) an edge of the tab and (2) the portion of the edge of the first circuit board not including the coating of the insulating material.

10. The method as set forth in claim 9, wherein step (c) further includes conformal coating a top surface and a bottom surface of the first circuit board.

11. The method as set forth in claim 9, further including:
(e) providing a second conductive sheet;
(f) selectively removing one or more portions of the second conductive sheet thereby defining a second circuit board, a second disposable part and at least one tab that extends between an edge of the second circuit board and an edge of the second disposable part;
(g) coating each edge of the second circuit board where one of the tabs does not extend therefrom with the insulating material;
(h) laminating the first and second circuit boards together; and
(i) separating the second circuit board from the second disposable part via each tab that extends therebetween such that said separation exposes one of (1) an edge of the tab and (2) the portion of the edge of the second circuit board not including the coating of the insulating material.

12. The method as set forth in claim 11, wherein step (g) further includes conformal coating a top surface and a bottom surface of the first circuit board.

13. A method of forming a circuit board comprising:
(a) providing a first conductive sheet coupled to a first disposable part by at least one tab that extends between an edge of the first conductive sheet and an edge of the first disposable part;
(b) coating at least each exposed edge of the first conductive sheet with an insulating material; and
(c) separating the first conductive sheet from the first disposable part via the tab(s) that extend between the edges thereof such that said separation exposes at least one of (1) an edge of each tab and (2) the portion(s) of the edge of the first conductive sheet not including the coating of the insulating material.

14. The method as set forth in claim 13, further including:
(d) providing a second conductive sheet coupled to a second disposable part by at least one tab that extends between an edge of the second conductive sheet and an edge of the second disposable part;
(e) coating at least each exposed edge of the second conductive sheet with the insulating material;
(f) joining the first and second conductive sheets together in spaced relation via the insulating material; and
(g) separating the second conductive sheet from the second disposable part via the tab(s) that extend between the edges thereof such that said separation exposes at least one of (1) an edge of each tab and (2) the portion(s) of the edge of the second conductive sheet not including the coating of the insulating material.

15. The method as set forth in claim 14, wherein at least one of step (b) and step (e) further includes conformal coating exposed surfaces of the first and second circuit boards, respectively.

* * * * *

UNITED STATES PATENT AND TRADEMARK OFFICE
CERTIFICATE OF CORRECTION

| | | |
|---|---|---|
| PATENT NO. | : 7,159,308 B2 | Page 1 of 1 |
| APPLICATION NO. | : 11/224197 | |
| DATED | : January 9, 2007 | |
| INVENTOR(S) | : Alan E. Wang, Kevin C. Olson and Thomas H. Di Stefano | |

It is certified that error appears in the above-identified patent and that said Letters Patent is hereby corrected as shown below:

Column 10, line 31: "The" should be inserted before the word "method" at the beginning of Claim 2.

Signed and Sealed this

Twentieth Day of January, 2009

JON W. DUDAS
*Director of the United States Patent and Trademark Office*